(12) United States Patent
Kimizuka et al.

(10) Patent No.: US 7,759,744 B2
(45) Date of Patent: Jul. 20, 2010

(54) SEMICONDUCTOR DEVICE HAVING HIGH DIELECTRIC CONSTANT LAYERS OF DIFFERENT THICKNESSES

(75) Inventors: Naohiko Kimizuka, Kanagawa (JP); Kiyotaka Imai, Kanagawa (JP); Yuri Masuoka, Kanagawa (JP); Toshiyuki Iwamoto, Tokyo (JP); Motofumi Saitoh, Tokyo (JP); Hirohito Watanabe, Tokyo (JP); Masayuki Terai, Tokyo (JP)

(73) Assignees: NEC Electronics Corporation, Kanagawa (JP); NEC Corporation, Tokyo (JP)

( * ) Notice: Subject to any disclaimer, the term of this patent is extended or adjusted under 35 U.S.C. 154(b) by 402 days.

(21) Appl. No.: 11/129,440

(22) Filed: May 16, 2005

(65) Prior Publication Data
US 2005/0253181 A1    Nov. 17, 2005

(30) Foreign Application Priority Data
May 14, 2004    (JP)    ............... 2004-144652

(51) Int. Cl.
| | |
|---|---|
| *H01L 29/76* | (2006.01) |
| *H01L 29/94* | (2006.01) |
| *H01L 31/062* | (2006.01) |
| *H01L 31/113* | (2006.01) |
| *H01L 31/119* | (2006.01) |
| *H01L 27/01* | (2006.01) |
| *H01L 27/12* | (2006.01) |
| *H01L 31/0392* | (2006.01) |
| *H01L 23/62* | (2006.01) |
| *H01L 27/10* | (2006.01) |
| *H01L 29/73* | (2006.01) |

(52) U.S. Cl. ............ 257/406; 257/204; 257/206; 257/338; 257/350; 257/351; 257/357; 257/369; 257/371; 257/410; 257/411; 257/E21.639

(58) Field of Classification Search ........ 257/204, 257/206, 338, 350–351, 357, 369, 371, 410–411, 257/406, E21.639
See application file for complete search history.

(56) References Cited

U.S. PATENT DOCUMENTS 5,480,828 A * 1/1996 Hsu et al. ............... 438/275

(Continued)

FOREIGN PATENT DOCUMENTS

JP    04-271166    9/1992

(Continued)

OTHER PUBLICATIONS

C Hobbs et al., "Fermi Level Pinning at the Polysi/Metal Oxide Interface", 2003 Symposium on VLSI Technology Digest of Technical Papers, 4-89114-0335-6/03, APRDL, Digital DNA Laboratories, Motorola, Austin, TX.

*Primary Examiner*—Ida M Soward
(74) *Attorney, Agent, or Firm*—Young & Thompson

(57) ABSTRACT

A semiconductor device 100 includes a silicon substrate 102, an N-type MOSFET 118 including a first high dielectric constant film 111 and a polycrystalline silicon film 114 on the silicon substrate 102, and a P-type MOSFET 120 including a second high dielectric constant film 12 and a polycrystalline silicon film 114 juxtaposed to N-type MOSFET 118 on the silicon substrate 102. The second high dielectric constant film 112 is formed to have the film thickness thinner than the film thickness of the first high dielectric constant film 111. The first high dielectric constant film 111 and the second high dielectric constant film 112 contains one or more element(s) selected from Hf and Zr.

1 Claim, 5 Drawing Sheets

U.S. PATENT DOCUMENTS

| | | | | |
|---|---|---|---|---|
| 6,107,134 | A * | 8/2000 | Lu et al. | 438/239 |
| 6,159,799 | A * | 12/2000 | Yu | 438/257 |
| 6,255,698 | B1 * | 7/2001 | Gardner et al. | 257/369 |
| 6,261,978 | B1 * | 7/2001 | Chen et al. | 438/224 |
| 6,346,445 | B1 * | 2/2002 | Hsu | 438/279 |
| 6,436,771 | B1 * | 8/2002 | Jang et al. | 438/275 |
| 6,486,682 | B1 * | 11/2002 | Wang et al. | 324/671 |
| 6,541,321 | B1 * | 4/2003 | Buller et al. | 438/197 |
| 6,573,134 | B2 * | 6/2003 | Ma et al. | 438/216 |
| 6,583,013 | B1 | 6/2003 | Rodder et al. | 438/276 |
| 6,670,248 | B1 | 12/2003 | Ang et al. | 438/287 |
| 6,686,298 | B1 * | 2/2004 | Beaman et al. | 438/775 |
| 6,723,658 | B2 * | 4/2004 | Eissa et al. | 438/745 |
| 6,734,527 | B1 * | 5/2004 | Xiang | 257/616 |
| 6,784,507 | B2 * | 8/2004 | Wallace et al. | 257/410 |
| 6,897,095 | B1 * | 5/2005 | Adetutu et al. | 438/119 |
| 6,919,251 | B2 * | 7/2005 | Rotondaro et al. | 438/287 |
| 6,967,130 | B2 * | 11/2005 | Chen et al. | 438/199 |
| 7,018,902 | B2 * | 3/2006 | Visokay et al. | 438/287 |
| 7,023,049 | B2 * | 4/2006 | Takebuchi et al. | 257/316 |
| 7,109,077 | B2 * | 9/2006 | Rotondaro et al. | 438/199 |
| 7,217,611 | B2 * | 5/2007 | Kavalieros et al. | 438/216 |
| 7,217,971 | B2 * | 5/2007 | Iwasaki et al. | 257/310 |
| 7,304,004 | B2 * | 12/2007 | Metzner et al. | 438/785 |
| 7,608,899 | B2 * | 10/2009 | Iwasaki et al. | 257/411 |
| 2003/0015763 | A1 * | 1/2003 | Yoneda | 257/411 |
| 2003/0062586 | A1 * | 4/2003 | Wallace et al. | 257/506 |
| 2003/0148625 | A1 * | 8/2003 | Ho et al. | 438/745 |
| 2003/0173586 | A1 * | 9/2003 | Moriwaki et al. | 257/200 |
| 2003/0183939 | A1 * | 10/2003 | Kakamu et al. | 257/762 |
| 2003/0222296 | A1 | 12/2003 | Kumar et al. | 257/301 |
| 2004/0023478 | A1 * | 2/2004 | Samavedam et al. | 438/592 |
| 2004/0124476 | A1 * | 7/2004 | Miyano | 257/371 |
| 2005/0127417 | A1 * | 6/2005 | Saenger et al. | 257/295 |
| 2005/0233562 | A1 * | 10/2005 | Adetutu et al. | 438/585 |

FOREIGN PATENT DOCUMENTS

| | | |
|---|---|---|
| JP | 06-222387 | 8/1994 |
| JP | 2001-024188 | 1/2001 |
| JP | 2002-280461 | 9/2002 |
| JP | 2002-359295 | 12/2002 |
| JP | 2003-309188 | 10/2003 |

* cited by examiner

SEMICONDUCTOR DEVICE HAVING HIGH DIELECTRIC CONSTANT LAYERS OF DIFFERENT THICKNESSES

This application is based on Japanese patent application NO. 2004-144652, the content of which is incorporated hereinto by reference.

BACKGROUND OF THE INVENTION

1. Field of the Invention

The present invention relates to a semiconductor device comprising an N-type metal oxide semiconductor field effect transistor (MOSFET) and a P-type MOSFET both containing high dielectric constant films.

2. Description of the Related Art

In recent years, the utilization of a thin film having high dielectric constant called high-k as a component material for semiconductor devices is actively investigated. Typical high-k materials include oxides of elements such as Zr, Hf and the like. The use of such materials for a gate insulating film of a MOSFET reduces a silicon oxide-conversion electrical thickness, even though the physical thickness of the gate insulating film is increased to a certain level, thereby providing physically and structurally stable gate insulating films. Thus, both or either one of an increase of metal oxide semiconductor (MOS) capacity for enhancing MOSFET characteristics and a reduction of a gate leakage current as compared with a conventional case of employing silicon oxide can be achieved.

Japanese Laid-open patent publication No. 2002-280,461 discloses a complementary metal oxide semiconductor (CMOS) device including an N-MOSFET and P-MOSFET employing such high-k material. The N-MOSFET and P-MOSFET include a gate insulating film composed of a low dielectric constant film such as silicon oxide and the like, and a high dielectric constant film and a gate electrode composed of polycrystalline silicon. The gate electrode is disposed so as to contact with the high dielectric constant film of the gate insulating film.

However, a comprehension is obtained according to the recent study, in which a phenomenon called Fermi level pinning is caused when the gate insulating film is composed of a high-k film and the gate electrode is composed of a polycrystalline silicon (C. Hobbs et al., entitled "Fermi Level Pinning at the Poly Si/Metal Oxide Interface", 2003 Symposium on VLSI Technology Digest of Technical Papers, 4-89114-035-6/03). It is considered that Fermi level pinning is caused when an energy level is created on the basis of chemical bonding of silicon with the above-described metal for composing the high-dielectric constant film diffusing through the polycrystalline silicon that composes the gate electrode, in vicinity of an interface on the side of the gate insulating film in the gate electrode.

When the metal composing the high dielectric constant film is diffused in the polycrystalline silicon of the gate electrode of the MOSFET, a depletion layer is created in the gate polycrystalline silicon in vicinity of an interface thereof with the gate insulating film. Sufficient electrical field cannot be applied to the gate insulating film due to an influence of such depletion layer even though a gate voltage is applied, and thus it is difficult to induce enough amount of carrier in the channel region. As a result, a problem is arisen, in which a threshold voltage is increased, and further a fluctuation in the threshold voltage is also increased.

Such Fermi level pinning is easy to be occurred in a P-type MOSFET that includes a gate electrode composed of a polycrystalline silicon containing P-type impurity, in particular in a case of employing Hf and/or Zr for the high dielectric constant film.

In the meantime, high dielectric constant films having same composition and same film thickness are employed for gate insulating films of N-type MOSFET and P-type MOSFET, which respectively constitute internal circuits of LSI in conventional CMOS devices. In such case, a problem is occurred that the gate leakage current generated in the N-type MOSFET is higher than that generated in the P-type MOSFET in the CMOS device. Therefore, the gate leakage current in the N-type MOSFET is focused in view of power consumption design, and a high dielectric constant film having a suitable film thickness, which is capable of sufficiently reducing the gate leakage current to an acceptable level, is deposited.

On the other hand, a threshold voltage for the P-type MOSFET employing a high dielectric constant film containing a specific element such as Hf, Zr and the like is increased to a level that is higher than that for the P-type MOSFET employing silicon oxide for the gate insulating film, for the reason stated above, and is eventually increased to a level that provides a difficult situation in establishing a desired threshold voltage by adjusting density of an impurity in the Si substrate.

SUMMARY OF THE INVENTION

The present inventors have found in the process of examining measures to the above-described problem that a quantity of an increase of the threshold voltage is dependent on the film thickness of the high dielectric constant film. In addition, the present inventors also have found that the reason for causing the above-described problem is not from an increase of MOS capacity caused by the reduction of the thickness of the high dielectric constant film, but from the fact that a quantity of the specific element originally contained in high dielectric constant film diffusing from the high dielectric constant film to the gate electrode is dependent on the film thickness thereof, and thus being attained to invent the present invention.

According to one aspect of the present invention, there is provided a semiconductor device, comprising: an N-type MOSFET including: a semiconductor substrate, a first gate insulating film, formed on the semiconductor substrate, and composed of a first high dielectric constant film containing one or more element(s) selected from a group consisting of Hf and Zr; and a first gate electrode, disposed on the first gate insulating film to contact with the first high dielectric constant film, and composed of a polycrystalline silicon film; and a P-type MOSFET including: a second gate insulating film, formed on the semiconductor substrate to be juxtaposed to the N-type MOSFET, and composed of a second high dielectric constant film containing one or more element(s) selected from a group consisting of Hf and Zr; and a second gate electrode, disposed on the second gate insulating film to contact with the second high dielectric constant film, and composed of a polycrystalline silicon film, wherein a film thickness of the second high dielectric constant film is less than a film thickness of the first high dielectric constant film.

In the configuration described above, the first high dielectric constant film and the second high dielectric constant film may also be composed of a chemical compound of one or more element(s) selected from a group consisting of Hf and Zr and one or more element(s) selected from a group consisting of Si, O and N.

The disclosure of C. Hobbs et al, entitled "Fermi Level Pinning at the Poly Si/Metal Oxide Interface", 2003 Symposium on VLSI Technology Digest of Technical Papers describes that Fermi level pinning is caused when a high-k film such as $HfO_2$ and the like is provided so as to contact with a polycrystalline silicon. Such Fermi level pinning is considerably influential to the operation of the P-type MOSFET. In particular, the influence to the P-type MOSFET becomes larger when the P-type MOSFET includes the high dielectric constant film containing Hf such as $HfO_2$ and HfAlO. However, since the second high dielectric constant film in the P-type MOSFET is formed to have thinner film thickness in the present invention, the quantity of the metal, which is originally contained in the second high dielectric constant film and is diffused into the polycrystalline silicon film, is reduced, even though the second high dielectric constant film contacts with the polycrystalline silicon film, and thus the generation of the depletion layer in the polycrystalline silicon can be avoided. This can diminish the influence of Fermi level pinning to the P-type MOSFET. Therefore, the increase of the threshold voltage of the P-type MOSFET can be inhibited and the fluctuation thereof can also be reduced.

In addition, the high dielectric constant film in the N-type MOSFET can be formed to have larger film thickness, and thus the enhancement of the gate leakage current, which is a problem for the N-type MOSFET, can be also inhibited.

The semiconductor devices according to the above-described aspects of the present invention may further has a configuration, in which the first high dielectric constant film and the second high dielectric constant film may contain Hf and Si. In addition, in such case, a content ratio of Hf for the total content of Hf and Si may be equal to or higher than 20 atomic % in the first high dielectric constant film and the second high dielectric constant film. More preferably, the content ratio of Hf for the total content of Hf and Si may be equal to or higher than 30%. The semiconductor devices according to the above-described aspects of the present invention may further have a configuration, in which the first high dielectric constant film and the second high dielectric constant film may be respectively and independently composed of HfSiO or HfAlO, or nitride thereof. In such case, a lower limit of the percentage of Hf over the total content of Hf and Al in HfAlO may be equal to or higher than 20 atomic %. Further, the semiconductor devices may have a configuration, in which the first high dielectric constant film and the second high dielectric constant film are free of Al.

The influence of Fermi level pinning in the P-type MOSFET may be a problem in the above-described cases. On the contrary, since the second high dielectric constant film in the P-type MOSFET is formed to have thinner film thickness in the present invention, this can diminish the influence of Fermi level pinning to the operation of the P-type MOSFET, as described above.

The semiconductor devices according to the above-described aspects of the present invention may further have a configuration, in which the first gate insulating film of the N-type MOSFET further includes a silicon oxide film provided between the semiconductor substrate and the first high dielectric constant film, and the second gate insulating film of the P-type MOSFET further includes a silicon oxide film provided between the semiconductor substrate and the second high dielectric constant film. The silicon oxide film may include nitrogen.

Diffusion, migration or the like of the metal contained in the first high dielectric constant film and the second high dielectric constant film into the semiconductor substrate can be prevented by providing the silicon oxide films between the semiconductor substrate and the first high dielectric constant film and between the semiconductor substrate and the second high dielectric constant film, respectively.

The semiconductor devices according to the above-described aspects of the present invention may further have a configuration, in which, in the first gate electrode of the N-type MOSFET in the semiconductor device, the polycrystalline silicon film includes an N-type impurity, and in the second gate electrode of the P-type MOSFET, the polycrystalline silicon film includes a P-type impurity.

Fermi level pinning described above is considerably caused when the polycrystalline silicon film containing P-type impurity contacts with the high dielectric constant film. On the contrary, since the second high dielectric constant film in the P-type MOSFET is formed to have thinner film thickness in the present invention, the quantity of the metal, which is originally contained in the second high dielectric constant film and is diffused into the polycrystalline silicon film, is reduced, even though the second high dielectric constant film contacts with the polycrystalline silicon film, and thus the generation of the depletion layer in the polycrystalline silicon can be avoided.

The semiconductor devices according to the above-described aspects of the present invention may further have a configuration, in which a relationship of a film thickness d1 of the first high dielectric constant film with a film thickness d2 of the second high dielectric constant film is: $d1/d2 \geq 1.5$. Further, while the upper limit thereof is not particularly limited, the upper limit thereof may be, for example, $d1/d2 \leq 3$.

The influence of Fermi level pinning can be moderated to reduce the threshold voltage and the increase of the gate leakage current can be inhibited by providing such relationship between the film thickness of the first high dielectric constant film and the film thickness of the second high dielectric constant film. When the first high dielectric constant film is composed of, for example, HfSiNO, the film thickness d1 may be equal to or higher than 1.5 nm. Having this configuration, the increase of the gate leakage current in the N-type MOSFET can be inhibited. In addition, the film thickness d2 of the second high dielectric constant film may be equal to or less than 1 nm, for example, and more preferably equal to or less than 0.5 nm. Having such configuration, the influence of Fermi level pinning can be reduced.

The semiconductor devices according to the above-described aspects of the present invention may further have a configuration, in which the N-type MOSFET and the P-type MOSFET compose internal circuits of LSI.

According to another aspect of the present invention, there is provided a method for manufacturing a semiconductor device including an N-type MOSFET and a P-type MOSFET, comprising: forming on an entire surface of a semiconductor substrate a first layer composed of a high dielectric constant material including one or more element(s) selected from a group consisting of Hf and Zr, said semiconductor substrate being provided with a P-well and an N-well that are juxtaposed; covering said first layer on said P-well with a protective film; selectively removing said first layer on said N-well through a mask of said protective film; forming on at least said N-well a second layer composed of a high dielectric constant material including one or more element(s) selected from a group consisting of Hf and Zr; forming a polycrystalline silicon film on said first layer and said second layer; selectively removing said first layer, said second layer and said polycrystalline silicon film to form the layers into a shape of a gate electrode, wherein said second layer is formed in said forming said second layer to provide a total film thickness of said first layer and said second layer on said N-well, which is thinner than a total film thickness of said first layer and said second layer on said P-well.

In such aspect of the present invention, the first layer and the second layer may also be composed of a chemical compound of one or more element (s) selected from a group consisting of Hf and Zr and one or more element(s) selected from a group consisting of Si, O and N.

The method for manufacturing the semiconductor devices according to the above-described aspect of the present invention may further have a configuration, in which the method further comprises, before forming the first layer, forming a silicon oxide film on the entire surface of the semiconductor substrate, wherein the first layer is formed on the silicon oxide film in the forming the first layer. The silicon oxide film may contain nitrogen.

The method for manufacturing the semiconductor devices according to the above-described aspect of the present invention may further have a configuration, in which the first layer and the second layer contain Hf and Si.

The method for manufacturing the semiconductor devices according to the above-described aspect of the present invention may further have a configuration, in which a content ratio of Hf for total content of Hf and Si is equal to or higher than 20% in said first layer and said second layer.

The method for manufacturing the semiconductor devices according to the above-described aspect of the present invention may further have a configuration, in which the first layer and said second layer are respectively and independently composed of HfSiO or HfAlO, or nitride thereof. In such case, a lower limit of the percentage of Hf over the total content of Hf and Al in HfAlO may be equal to or higher than 20 atomic %.

Further, the semiconductor devices may have a configuration, in which the first high dielectric constant film and the second high dielectric constant film are free of Al.

According to the present invention, the controllability of the threshold voltage of the P-type MOSFET within an desired range by reducing the threshold voltage of the P-type MOSFET is provided while preventing an increase of the gate leakage current in N-type MOSFET for the semiconductor device that comprises the N-type MOSFET and P-type MOSFET including high dielectric constant films.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be presented.

First Embodiment

Figure 1:
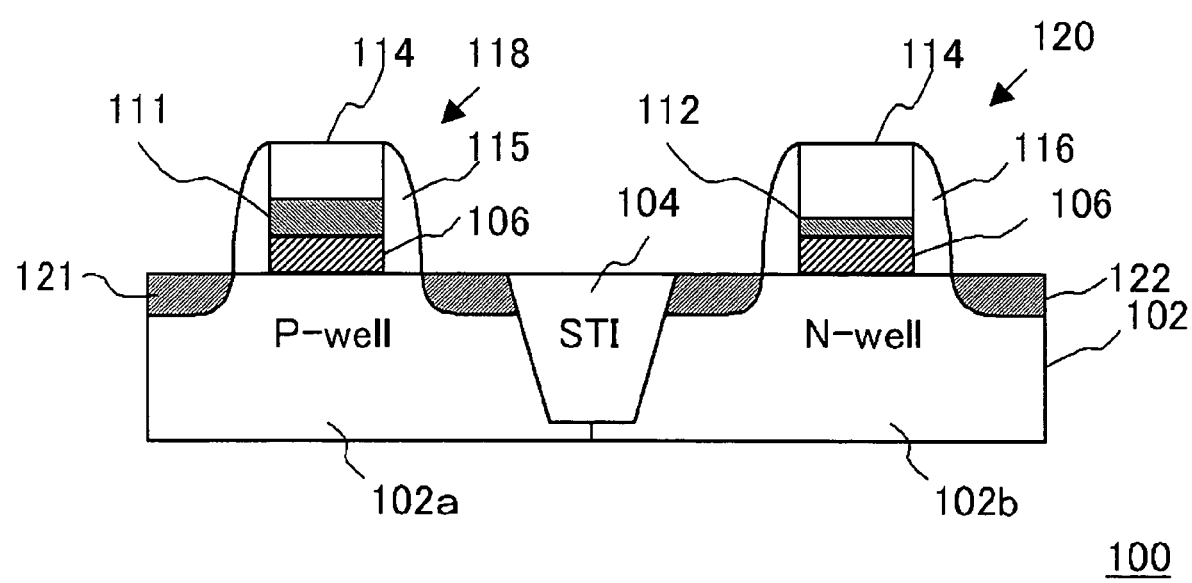
FIG. 1 is a cross-sectional view of an exemplary configuration of a semiconductor device in an embodiment of the present invention.

FIG. 1 is a cross-sectional view, illustrating a configuration of a semiconductor device in this embodiment.

In this embodiment, the semiconductor device 100 is a complementary metal oxide semiconductor (CMOS) device including an N-type MOSFET 118 and a P-type MOSFET 120. In addition, this CMOS device composes an internal circuit of a LSI.

The semiconductor device 100 comprises a silicon substrate 102, which has a P-well 102a of P-type conductivity and an N-well 102b of N-type conductivity provided thereon and a device separating-region 104 for separating the P-well 102a from the N-well 102b. An N-type MOSFET 118 and a P-type MOSFET 120 are formed in the P-well 102a and the N-well 102b, respectively.

A pair of impurity diffusion regions 121 is provided in the P-well 102a, and a channel region is formed therebetween. On the channel region is provided with a gate, which comprises a gate insulating film having a silicon oxide film 106 and a first high dielectric constant film 111 formed thereon in this sequence, a gate electrode provided on the gate insulating film and composed of a polycrystalline silicon film 114 and a side wall insulating film 115. Here, the polycrystalline silicon film 114 is disposed so as to contact with the first high dielectric constant film 111. The polycrystalline silicon film 114 of the N-type MOSFET 118 is doped with an N-type impurity. The N-type MOSFET 118 is constituted by these components.

Similarly, a pair of impurity diffusion regions 122 is provided in the N-well 102b, and a channel region is formed therebetween. On the channel region is provided with a gate, which comprises a gate insulating film having a silicon oxide film 106 and a second high dielectric constant film 112 formed thereon in this sequence, a gate electrode provided on the gate insulating film and composed of a polycrystalline silicon film 114 and a side wall insulating film 116. Here, the polycrystalline silicon film 114 is disposed so as to contact with the second high dielectric constant film 112. The polycrystalline silicon film 114 of the P-type MOSFET 120 is doped with a P-type impurity. The P-type MOSFET 120 is constituted by these components.

The first high dielectric constant film 111 and the second high dielectric constant film 112 are films having higher relative dielectric constant than silicon oxide, and so-called high-k film can be employed for these films. The first high dielectric constant film 111 and the second high dielectric constant film 112 may be composed of a material having relative dielectric constant of equal to or higher than 10. More specifically, the first high dielectric constant film 111 and the second high dielectric constant film 112 may be composed of a material containing one or more element selected from a group consisting of Hf and Zr, respectively, and the available films may be an oxide film containing any of the above-described element, a silicate film or the like. The use of such materials increases the relative dielectric constants of the first high dielectric constant film 111 and the second high dielectric constant film 112, while providing improved heat resistances. This feature can contribute a miniaturization and an improvement on the reliability of the MOSFET. The first high dielectric constant film 111 and the second high dielectric constant film 112 may be composed of the same material or may be composed of different materials.

The first high dielectric constant film 111 and the second high dielectric constant film 112 may be composed of a material containing Hf and Si. In such case, the content ratio of Hf over the total content of Hf and Si can be equal to or higher than 20 atomic %. In addition, the first high dielectric constant film 111 and the second high dielectric constant film 112 may be respectively and independently composed of HfSiO or HfAlO, or nitride thereof. In such case, a lower limit of the percentage of Hf for the total content of Hf and Al in HfAlO may be equal to or higher than 20 atomic %. Further, the semiconductor devices may have a configuration, in which the first high dielectric constant film and the second high dielectric constant film are free of Al.

In the present embodiment, the second high dielectric constant film 112 of the P-type MOSFET 120 is formed to have the film thickness in the laminating direction, which is thinner than the film thickness of the first high dielectric constant film 111 of the N-type MOSFET 118. Hereinafter, a simple statement as "film thickness" particularly indicates the film thickness in the laminating direction. In order to inhibit the increase of the gate leakage current in the N-type MOSFET 118 and to reduce the influence of Fermi level pinning to the P-type MOSFET 120 in the semiconductor device 100 comprising the N-type MOSFET 118 and the P-type MOSFET 120, it is preferable to have a configuration, in which the relationship of the film thickness d1 of the first high dielectric constant film 111 with the film thickness d2 of the second high dielectric constant film 112 is presented as: $d1/d2 \geq 1.5$.

The film thickness of the first high dielectric constant film 111 of the N-type MOSFET 118 may be, for example, equal to or larger than 1.5 nm. Having this configuration, the increase of the gate leakage current in the N-type MOSFET 118 can be inhibited. Further, while the upper limit thereof is not particularly limited, the upper limit thereof may be, for example, $d1/d2 \leq 3$. The film thickness d2 of the second high dielectric constant film 112 of the P-type MOSFET 120 may be equal to or less than 1 nm, for example, and more preferably equal to or less than 0.5 nm. Having such configuration, influence of Fermi level pinning can be reduced.

When the materials containing the above-described elements are employed for the materials composing the first high dielectric constant film 111 and the second high dielectric constant film 112, a problem of increasing the threshold voltage may be occurred due to the influence of Fermi level pinning in the P-type MOSFET 120. However, since the second high dielectric constant film 112 in the P-type MOSFET 120 is formed to have thinner film thickness according to the configuration of the semiconductor device 100 in the present embodiment, this can diminish the influence of Fermi level pinning. On the other hand, since the first high dielectric constant film 111 of the N-type MOSFET 118 is formed to have thicker film thickness, the increase of the gate leakage current can also be inhibited.

Although it is not intended to particularly limit the scope of the invention, the N-type MOSFET 118 and the P-type MOSFET 120 can be typically formed to have substantially same film thickness in the laminating direction in the silicon oxide films 106.

FIGS. 2A to 2D and FIGS. 3E to 3H are cross-sectional views, illustrating an example of a manufacturing procedure for the semiconductor device 100 having the configuration shown in FIG. 1.

Figure 2A:
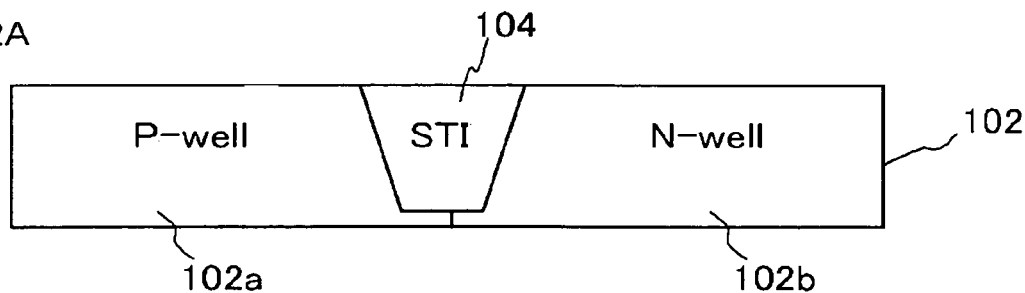
FIGS. 2A to 2D are cross-sectional views of the semiconductor device, illustrating an exemplary manufacturing procedure of the semiconductor device in the embodiment of the present invention.

At first, an element-separating region 104 is formed according to a shallow trench isolation (STI) in the silicon substrate 102 via a known technique, and thereafter, a P-type impurity is ion-implanted to form the P-well 102a and an N-type impurity is ion-implanted to form the N-well 102b, respectively (FIG. 2A). The element-separating region 104 may be formed via other known methods such as, for example, local oxidation of silicon (LOCOS) method or the like.

Subsequently, channel regions are formed in the P-well 102a and the N-well 102b, respectively, via a known technique. Here, an N-type impurity and a P-type impurity can be ion-implanted into the lower parts of the channel regions of the P-well 102a and the N-well 102b, respectively, to form punch through stop regions. The short-channel effect thereto can be inhibited by forming such punch through stop regions.

Figure 2B:
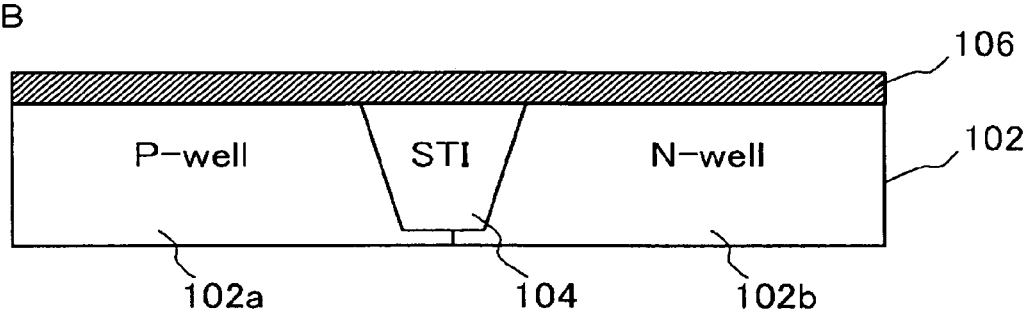

Subsequently, a silicon oxide film 106 (having film thickness of, e.g., 1 nm to 2 nm) is formed on the surface of the silicon substrate 102 (FIG. 2B). The silicon oxide film 106 can be formed by, for example, conducting a thermal oxidation on the surface of the silicon substrate 102. A condition for conducting the thermal oxidation may be, for example, at a process temperature of 900 degree C. and for a duration time of on the order of from 40 to 50 seconds.

Figure 2C:
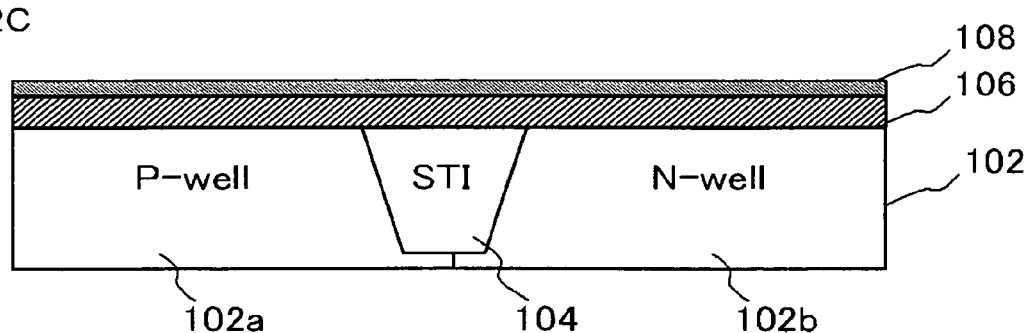

Subsequently, a high dielectric constant film 108 (having a film thickness of, e.g., about 1 nm) is formed on the silicon oxide film 106 (FIG. 2C). The high dielectric constant film 108 may be deposited via a chemical vapor deposition (CVD), an atomic layer deposition (ALD) or the like. Hafnium silicate is employed for depositing the high dielectric constant film 108 in the present embodiment. The deposition thereof is conducted by using an organic hafnium source gas, an oxidizing gas and a silicon-containing gas. Here, oxygen may be employed for the oxidizing gas and monosilane ($SiH_4$) may be employed for the silicon-containing gas, for example.

Thereafter, an annealing is carried out by using, for example, a nitrogen-containing gas such as ammonia. The processing condition thereof may be, for example, at a process temperature of 900 to 1,000 degree C. and for a duration time of 40 seconds or the like. An unwanted crystallization of hafnium silicate can be prevented by conducting the annealing process.

Figure 2D:
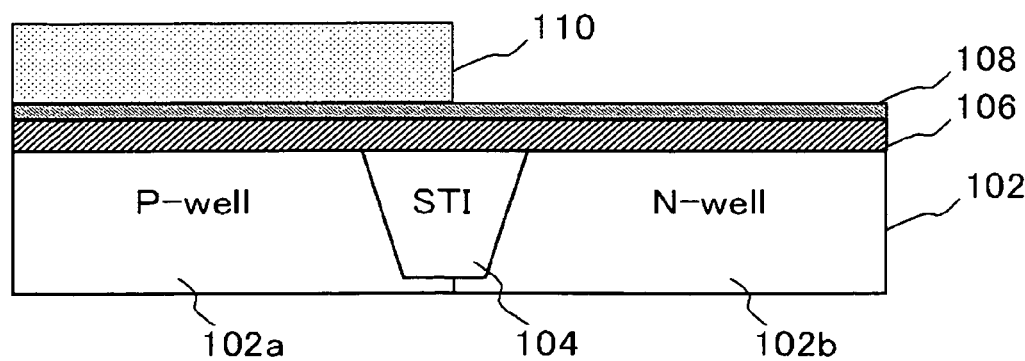
Figure 3E:
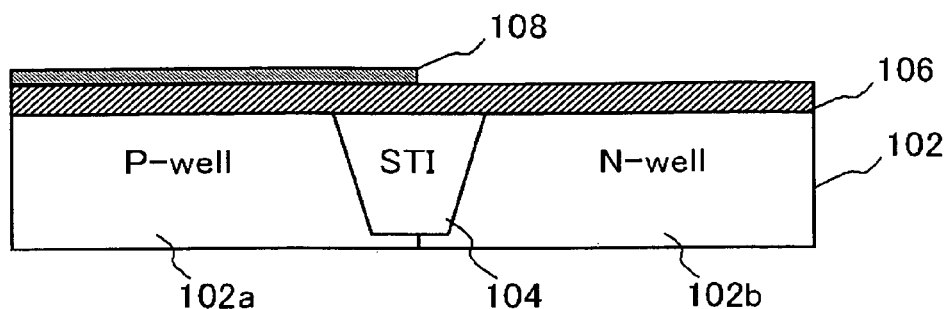
FIGS. 3E to 3H are cross-sectional views of the semiconductor device, illustrating an exemplary manufacturing procedure of the semiconductor device in the embodiment of the present invention.

Subsequently, a photo resist 110 is formed on the P-well 102a (FIG. 2D). The photo resist 110 is formed by applying a resist over the surface of the high dielectric constant film 108 and then exposing and developing thereof through a mask for patterning (not shown). Then, a wet etching is carried out, by using, for example, diluted fluorinated acid (DHF). This procedure provides a selective removal of the high dielectric constant film 108 on the N-well 102b. Subsequently, the photo resist 110 is stripped under the dry atmosphere employing, for example, ozone, so as not to remove the high dielectric constant film 108 on the P-well 102a (FIG. 3E).

Figure 3F:
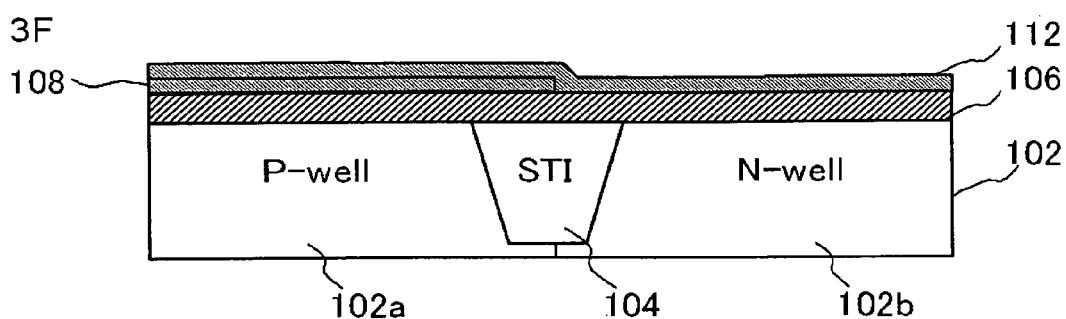

Then, the second high dielectric constant film 112 (having a film thickness of, e.g., about 0.7 nm) is formed on the high dielectric constant film 108 and the silicon oxide film 106 (FIG. 3F). The second high dielectric constant film 112 can be formed similarly as in forming the high dielectric constant film 108. The above-mentioned process provides forming the high dielectric constant film on the P-well 102a having thicker film thickness than the high dielectric constant film on the N-well 102b.

Figure 3G:
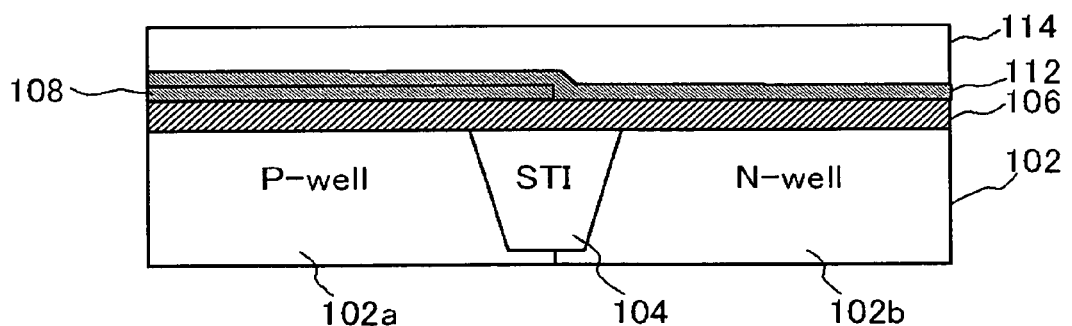

Thereafter, the polycrystalline silicon film 114 is formed on the second high dielectric constant film 112 (FIG. 3G). Then, an N-type impurity is ion-implanted into the polycrystalline silicon film 114 deposited on the P-well 102a, and a P-type impurity is ion-implanted into the polycrystalline silicon film 114 deposited on the N-well 102b.

Figure 3H:
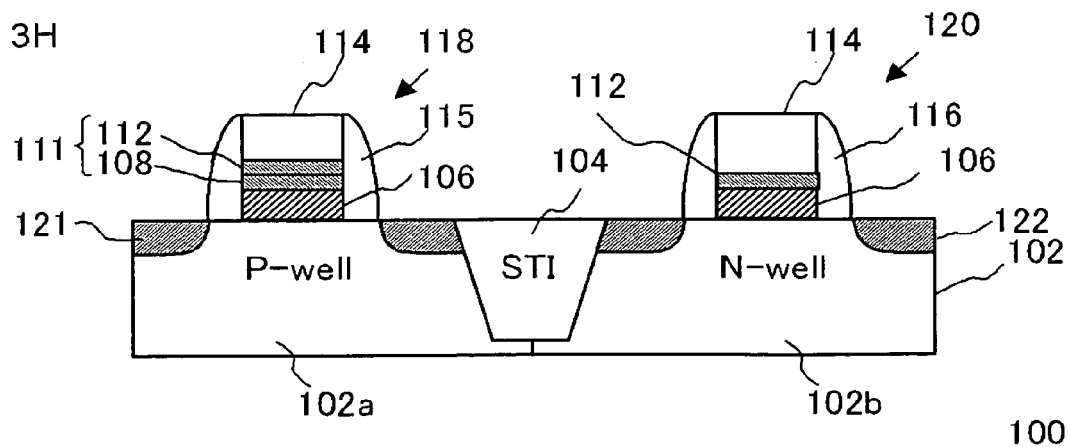

Subsequently, the silicon oxide film 106, the high dielectric constant film 108, the second high dielectric constant film 112 and the polycrystalline silicon film 114 are selectively dry-etched to form the shape of the gate electrode. Then, on the P-well 102a, a side wall insulating film 115 is formed to cover the respective side walls of the silicon oxide film 106, the high dielectric constant film 108, the second high dielectric constant film 112 and the polycrystalline silicon film 114. Similarly, on the N-well 102b, a side wall insulating film 116 is formed to cover the respective side walls of the silicon oxide film 106, the second high dielectric constant film 112 and the polycrystalline silicon film 114 (FIG. 3H). The side wall insulating film 115 and the side wall insulating film 116 can be formed via an anisotropic etch process by using, for example, a fluorocarbon gas or the like. It is noted that the first high dielectric constant film 111 is composed of the high dielectric constant film 108 and the second high dielectric constant film 112.

Subsequently, source/drain extension regions, which are electric connecting sections between the channel regions and the impurity diffusion regions described later, are formed on the surface of the P-well 102a and the N-well 102b, respectively.

Next, concerning the surface of the P-well 102a, the outer layer of the P-well 102a is doped with an N-type impurity such as P, As and the like through a mask of the gate electrode and the side wall insulating film 115 to form the impurity diffusion region 121. Similarly, concerning the surface of the N-well 102b, the outer layer of the N-well 102b is doped with a P-type impurity such as B, Al and the like through a mask of the gate electrode and the side wall insulating film 116 to form the impurity diffusion region 122. The source region and the drain region are formed according to this procedure. Thereafter, an activation of the doped impurities is carried out by thermally processing thereof within a non-oxidizing atmosphere. The semiconductor device 100, which is the CMOS device, is formed by the above-mentioned process.

In this embodiment, quantity of a metal (Hf in this embodiment) diffusing into the polycrystalline silicon film 114 from the second high dielectric constant film 112 can be reduced for the P-type MOSFET 120, which is vulnerable by Fermi level pinning, by having thinner film thickness of the second high dielectric constant film 112, thereby reducing the generation of the depletion layer in the polycrystalline silicon film 114. This can reduce the threshold voltage in the P-type MOSFET. Having such configuration, the threshold voltage in the P-type MOSFET can be controlled within a desired voltage range by adjusting a concentration of the impurity that is implanted into the silicon substrate. On the other hand, in the N-type MOSFET 118, a problem of increasing the gate leakage current is occurred, if the first high dielectric constant film 111 is provided to have thinner film thickness, similarly as in the second high dielectric constant film 112. However, in this embodiment, the film thickness of the first high dielectric constant film 111 of the N-type MOSFET 118 can be controlled independently from the second high dielectric constant film 112 to provide the thicker film thickness than the thickness of the second high dielectric constant film 112, and therefore the increase of the gate leakage current in the N-type MOSFET 118 is prevented. As such, according to the semiconductor device 100 in the present embodiment, Fermi level pinning in the P-type MOSFET 120 can be inhibited without increasing the gate leakage current in the N-type MOSFET 118. In addition, according to the semiconductor device 100 in the present embodiment, the gate leakage current in the N-type MOSFET 118 is not increased, thereby keeping the power consumption in the standby condition to a level equivalent to the conventional device.

Second Embodiment

Figure 4:
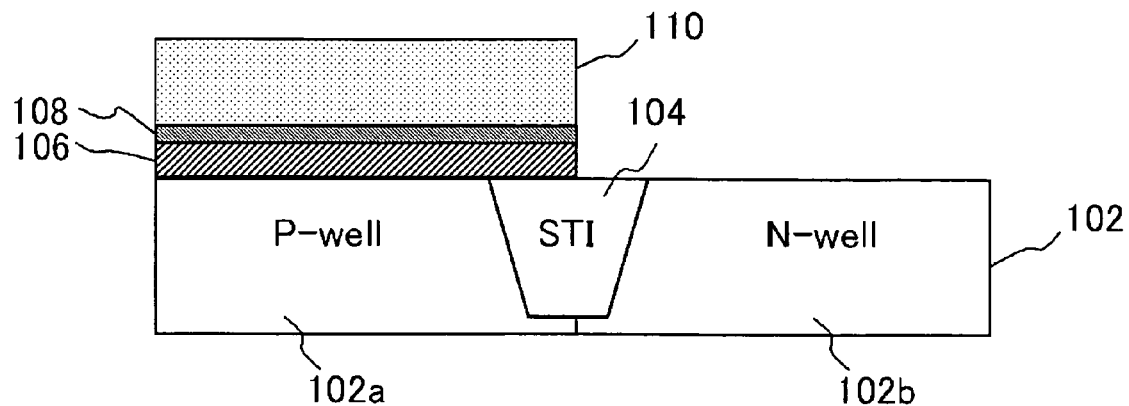
FIG. 4 is a cross-sectional view of the semiconductor device, illustrating an intermediate stage in the manufacturing procedure of the semiconductor device in the embodiment of the present invention.

In this embodiment, similar process as described in the first embodiment in reference to FIG. 2A to FIG. 2D is conducted, and more specifically the silicon oxide film 106 and the high dielectric constant film 108 are formed on the silicon substrate 102 and the photo resist 110 is formed over the P-well 102a. A wet etching process is conducted by using, for example, diluted fluorinated acid (DHF) to selectively remove the high dielectric constant film 108 and the silicon oxide film 106 on the N-well 102b (FIG. 4). The present embodiment is different from the first embodiment in the point that the silicon oxide film 106 is also removed with the high dielectric constant film 108.

Subsequently, the photo resist 110 is removed and thereafter, a thermal oxidation is conducted on the surface of the N-well 102b of the silicon substrate 102 to form a silicon oxide film (not shown) on the N-well 102b. Subsequently, the high dielectric constant film is formed on the silicon oxide film 106 and on the silicon oxide film disposed on the N-well 102b. Such high dielectric constant film can be formed similarly as in the formation of the high dielectric constant film 108.

Film thickness of the silicon oxide film formed on the N-well 102b may be substantially same as the film thickness of the silicon oxide film 106, or may be thinner or thicker than the film thickness of the silicon oxide film 106.

Figure 5:
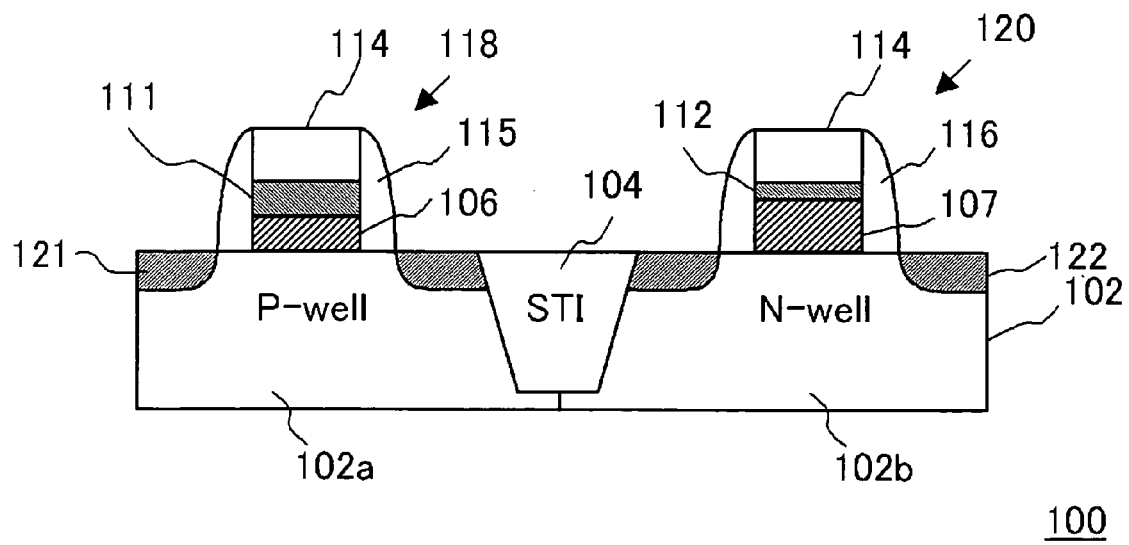
FIG. 5 is a cross-sectional view of the semiconductor device, illustrating an exemplary configuration of a semiconductor device in an embodiment of the present invention.

For example, the film thickness of the silicon oxide film disposed on the N-well 102b may be substantially equal to a total film thickness of the film thickness of the silicon oxide film 106 and the high dielectric constant film 108. Example of such situation is shown in FIG. 5.

Since the silicon oxide film is formed on the N-well 102b after removing the high dielectric constant film 108 according to the method for manufacturing the semiconductor device 100 in the present embodiment, there is no concern about generating a defect in the silicon oxide film when the high dielectric constant film 108 is etched off. Therefore, the high dielectric constant film 108 can be etched off under various conditions.

EXAMPLE

Figure 6:
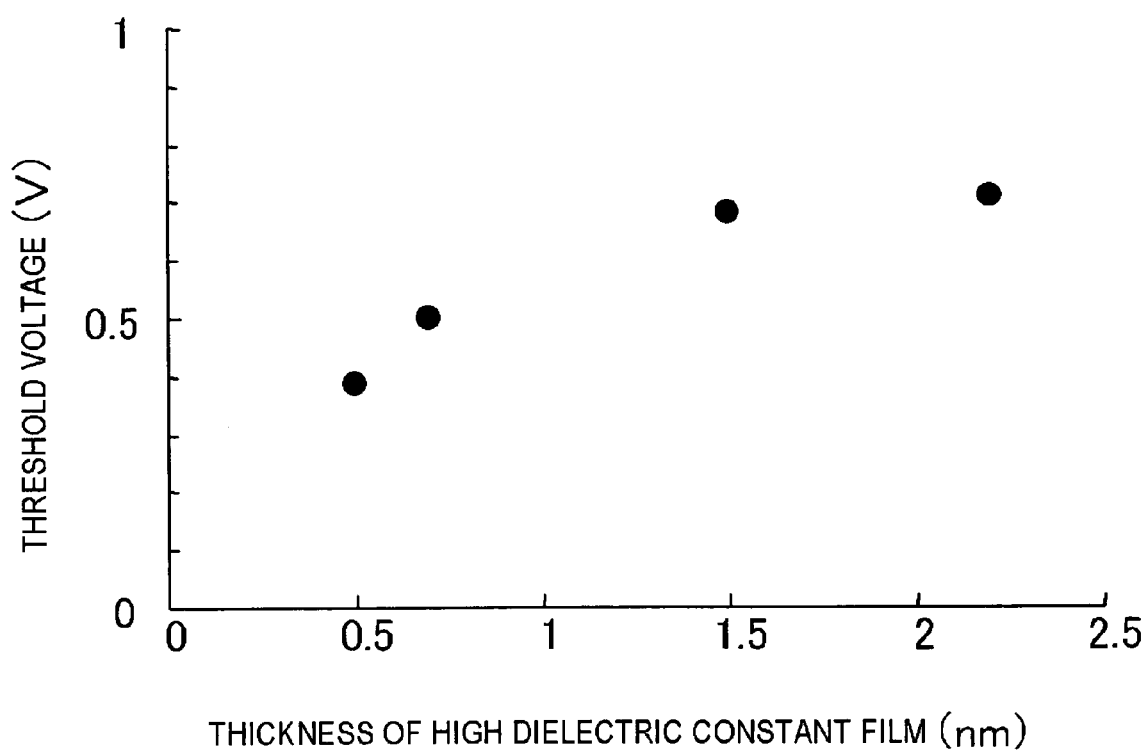
FIG. 6 is a graph showing a relationship of the threshold voltage over the film thickness of the high dielectric constant film in the P-type MOSFET.

The P-type MOSFET 120 described in the first embodiment and having the configuration shown in FIG. 1 was employed to investigate a relationship of the film thickness of the second high dielectric constant film 112 with the threshold voltage in the P-type MOSFET 120. The results thereof are shown in FIG. 6.

As can be seen in the graph, thicker film thickness of the second high dielectric constant film 112 provides an increase of the threshold voltage in the P-type MOSFET 120. It was exhibited that the threshold voltage was in a level that is applicable to the manufacturing application (not higher than about 0.5 V) when the film thickness of the second high dielectric constant film 112 was equal to or less than 1 nm. In addition, it was found that the increase of the threshold voltage could be more effectively controlled by providing the film thickness of the second high dielectric constant film 112 as not greater than 0.5 nm. The P-type MOSFETs 120 having different film thicknesses of the silicon oxide films 106 were examined, and similar results were exhibited in all of the examinations.

On the other hand, it was also indicated that the influence of the gate leakage current is reduced when the film thickness of the first high dielectric constant film 111 in the N-type MOSFET 118 is equal to or greater than 1.5 nm, although it is not shown in this graph.

It was found from the above-mentioned results that both of the influence of the gate leakage current and the influence of Fermi level pinning in the CMOS device can be reduced when the relationship of the film thickness d1 of the first high dielectric constant film 111 with the film thickness d2 of the second high dielectric constant film 112 is presented as: $d1/d2 \geqq 1.5$.

While the preferred embodiments of the present invention have been described above in reference to the annexed figures, it should be understood that the disclosures above are presented for the purpose of illustrating the present invention, and various configurations other than the above-described configurations can also be adopted.

For example, while the configuration employing the hafnium silicate film as the high dielectric constant film is described in the above-described embodiment, in addition thereto, oxide film of Hf, Zr or the like, silicate film of Hf, Zr or the like, oxynitride film of Hf, Zr or the like can similarly be employed. Further, the high dielectric constant film 108 and the second high dielectric constant film 112 maybe formed of different materials, respectively, in the process described in the first embodiment in reference to FIGS. 2A to 2D and FIGS. 3E to 3H. Moreover, the first high dielectric constant film 111 and the second high dielectric constant film 112 shown in FIG. 1 may also have laminated structures comprising a plurality of high dielectric constant films having different compositions, respectively.

Further, the present invention is not limited to Hf and Zr, but is applicable to an N-type MOSFET and a P-type MOSFET having a gate. insulating film containing an element, which may otherwise be diffused into the polycrystalline silicon film as being contacted with the polycrystalline silicon film to possibly cause Fermi level pinning.

While it was described that the photo resist 110 is removed in the process described in reference to FIG. 3E in the first embodiment and the second high dielectric constant film 112 is formed on the P-well 102a in the process described in reference to FIG. 3F, the second high dielectric constant film 112 may be formed only on the N-well 102b while remaining the photo resist 110. In this case, the film thickness of the high dielectric constant film 108 can be adjusted to a thickness, which provides sufficiently lower gate leakage current in the N-type MOSFET 118 that will not cause any problem. As such, the first high dielectric constant film 111 and the second high dielectric constant film 112 can be formed via various types of processes.

While a configuration of removing the high dielectric constant film 108 on the N-well 102b in the process described in reference to FIG. 3E is described in the first embodiment, the high dielectric constant film 108 may not be completely removed. In addition, the high dielectric constant film 108 on N-well 102b may be removed and simultaneously the silicon oxide film 106 on the N-well 102b may also be partially removed. It is satisfactory in the present invention that the desired film thickness of the first high dielectric constant film 111 of the N-type MOSFET 118 and the desired film thickness of the second high dielectric constant film 112 of the P-type MOSFET 120 may be eventually attained, respectively.

It is apparent that the present invention is not limited to the above embodiment, that may be modified and changed without departing from the scope and spirit of the invention.

What is claimed is:

1. A semiconductor device, comprising:
   a semiconductor substrate;
   an N-type metal oxide semiconductor field effect transistor (MOSFET) including:
   a first gate insulating film, formed on said semiconductor substrate, and composed of a first high dielectric constant film containing one or more element(s) selected from a group consisting of Hf and Zr; and
   a first gate electrode composed of a polycrystalline silicon film, said polycrystalline silicon film being disposed on said first gate insulating film to contact with said first high dielectric constant film; and
   a P-type MOSFET including:
   a second gate insulating film, formed on said semiconductor substrate to be juxtaposed to said N-type MOSFET, and composed of a second high dielectric constant film containing one or more element(s) selected from a group consisting of Hf and Zr; and
   a second gate electrode composed of a polycrystalline silicon film, said polycrystalline silicon film being disposed on said second gate insulating film to contact with said second high dielectric constant film,
   wherein a film thickness of said second high dielectric constant film is less than a film thickness of said first high dielectric constant film, wherein said first high dielectric constant film and said second high dielectric constant film include Hf and Si, and a content ratio of Hf for total content of Hf and Si is equal to or higher than 20% in said first high dielectric constant film and said second high dielectric constant film.

* * * * *